United States Patent
Pfannenberg (10) Patent No.: US 9,883,609 B2
(45) Date of Patent: Jan. 30, 2018

(54) FILTER FAN WITH A QUICK FIXING DEVICE

(75) Inventor: Andreas Pfannenberg, Hamburg (DE)

(73) Assignee: PFANNENBERG GMBH, Hamburg (DE)

( * ) Notice: Subject to any disclaimer, the term of this patent is extended or adjusted under 35 U.S.C. 154(b) by 341 days.

(21) Appl. No.: 11/811,269

(22) Filed: Jun. 8, 2007

(65) Prior Publication Data

US 2008/0045134 A1 Feb. 21, 2008

(30) Foreign Application Priority Data

Jun. 13, 2006 (DE) .................... 20 2006 009 355 U
Feb. 5, 2007 (DE) .................... 20 2007 001 887 U (51) Int. Cl.
*H05K 7/20* (2006.01)
*F04D 29/70* (2006.01)

(52) U.S. Cl.
CPC ....... *H05K 7/20181* (2013.01); *F04D 29/703* (2013.01)

(58) Field of Classification Search
CPC ....................................................... H05K 7/20
USPC ........................................................ 454/184
See application file for complete search history.

(56) References Cited

U.S. PATENT DOCUMENTS 3,204,546 A * 9/1965 Krell ............................ 454/272
4,598,894 A 7/1986 Johannes
4,834,615 A 5/1989 Mauch et al.
5,022,900 A 6/1991 Bar-Yona et al.
6,189,848 B1 2/2001 Barnett et al.
6,517,598 B2 * 2/2003 Anderson et al. .............. 55/498
2002/0094772 A1 7/2002 Gough
2005/0144914 A1 * 7/2005 Huehn et al. .................. 55/471

FOREIGN PATENT DOCUMENTS

| DE | 202006009355 | 10/2006 |
|---|---|---|
| EP | 0 352 113 | 1/1990 |
| EP | 0 439 667 | 8/1991 |
| EP | 1 370 125 | 12/2003 |
| EP | 1262095 B1 | 9/2004 |
| EP | 1 720 395 | 11/2006 |
| RU | 37585 A | 4/2004 |
| RU | 2004124707 A | 1/2006 |

OTHER PUBLICATIONS

A full EPO English translation of EP 0439667.*

* cited by examiner

Primary Examiner — Steven B McAllister
Assistant Examiner — Samantha Miller
(74) Attorney, Agent, or Firm — Lucas & Mercanti, LLP; Klaus P. Stoffel (57) ABSTRACT

The filter fan with a basic casing with a frame which is provided with quick fixing devices in form of spring-elastic preferably wing-type brackets is configured in such a manner that the frame is configured continuously closed all around its periphery and the brackets configured as plate-shaped blanks are molded on the frame, brackets which are provided with a number of slits for constituting spring-elastic snap-in tongues.

15 Claims, 10 Drawing Sheets

FILTER FAN WITH A QUICK FIXING DEVICE

BACKGROUND OF THE INVENTION

1. Field of the Invention

The present invention relates to a filter fan with a quick fixing device.

2. Description of the Related Art

Filter fans which are placed in a corresponding opening in a casing wall, for example of a switch cupboard, serve for the ventilation of switch cupboards, electronic control devices and computers. The filter fans have a blast in order to feed ambient air into the casing, wherein the casing is additionally provided with air exit slits. In order to avoid a contamination of the electronic devices in the casing, the filter fan has a filtering device, for example in form of a replaceable filter mat.

Such a filter fan is known from the EP 0 439 667 B1, wherein the filter fan has a basic casing with a frame. Quick fixing devices in form of spring-elastic brackets are configured on the frame in order to place the filter fan without additional screws or other mounting means without any tool into a casing opening and to be able to let it catch there by means of the spring-elastic brackets.

Furthermore, according to the DE 20 2006 009 355.9, a filter fan with a basic casing with a frame is known, wherein the frame is provided with quick coupling devices in form of spring-elastic, preferably wing-type brackets. The frame is configured continuously closed all around its periphery, wherein the brackets are molded on the frame. For this filter fan, the quick fixing devices in form of spring-elastic brackets are not cut out from a section of a side wall or of a frame of the basic casing of the filter fan but are molded on the outside on this frame or on the side walls. The filter fan or its basic casing is made of an injection molded part made of plastics so that during the manufacturing of the frame the additional brackets are already molded in one piece with the frame thereon or can be configured in one piece. This being, the brackets are placed practically on the outside on the frame and are orientated outwards for example in a cutout in a mounting wall when the filter fan is mounted. Moreover, the frame is configured continuous throughout, this being seen around the periphery of the filter fan, for example as a single component. Due to the additional molding of spring-elastic brackets on the frame of the filter fan, there are no openings any longer in lateral outer walls and the frame is configured substantially closed throughout around the periphery of the filter fan. Thus, the penetration of unfiltered air, for example into a computer casing, is efficiently avoided. No water can penetrate through the side walls into the inside of the filter either and thus a filter mat cannot suck itself full with moisture.

This being the case, it must however be considered disadvantageous that in the lacquered sheet metal cutouts of a mounting wall an insufficient catching of the brackets is achieved in the edge area of the sheet metal cutouts which is due to the fact that the peripheral edge of the sheet metal cutout does not have the configuration of sharp edges which is necessary for a perfect catching. Due to the coat of lacquer on the sheet metal of the switch cupboard, among others also in the edge or border area of the sheet metal cutouts, no sharp edges are necessary for a perfect catching so that the roundings created by the coat of lacquer in the edge area do not guarantee any sufficient support of the brackets in the edge or border areas of sheet metal cutouts. Add to this that for this filter fan the whole corner of the quick fixing device is cramped on an oblique contour so that the matter is here not of a direct catching which results in that the fit of the catching corners in lacquered sheet metal plates was insufficiently sure because of the rounded edges in the sheet metal because of the applied colour and thus because of the missing sharp edges and that it could thus come to an autonomous disengagement of the filter fan from its support in the sheet metal cutout of the switch cupboard.

It is apparent that the filter fan can be additionally equipped in a way known in itself with a filter mat and/or a blast and/or air conduction devices or the like. Of course lamellae which serve as air conduction device can also be configured swivellingly moving. It is basically possible to place only one single or preferably several spring-elastic brackets on the frame, as described hereunder.

SUMMARY OF THE INVENTION

The object of this invention is to configure a filter fan in such a manner that the sucking of unfiltered air and the penetration of moisture and water into the inside of the casing of the filter fan is avoided and that moreover tight and however removable snap-in connections are obtained, even for different sheet metal thicknesses between the filter fan and the sheet metal cutout of the mounting wall, for example of a switch cupboard.

In accordance with the invention, this object is achieved by the fact that the frame is configured so as to be continuously closed all around its periphery and the brackets configured as plate-shaped blanks are molded on the frame brackets which are provided with a number of slits for constituting spring-elastic snap-in tongues.

Accordingly, the filter fan according to this invention is configured with a basic casing which is provided with quick fixing devices in form of spring-elastic preferably wing-type brackets in such a manner that the frame is configured continuously closed all around its periphery and the brackets configured as plate-shaped blanks are molded on the frame, brackets which are provided with a number of slits for constituting spring-elastic snap-in tongues.

In an embodiment of the invention, the filter fan is provided with a square or a rectangular basic casing or a basic casing which has another geometrical shape with a design cover, with air passage slits and with a neck-type reduced peripheral frame which has quick fixing devices in form of spring-elastic bracket-shaped snap-in elements for the removable fixing of the filter fan on the peripheral mounting edge of a cutout in the mounting wall of a switch cupboard or the like, wherein several plate-shaped blanks which form the snap-in elements are configured on the outside on the peripheral closed wall face of the frame of the basic casing, each plate-shaped blank being molded on the one end on the wall face of the frame and having one or several spring-elastic snap-in tongues formed by a corresponding number of slits which are transversally to the longitudinal direction of the wall surface of the frame, the snap-in tongues having approximately a length which corresponds to the width of the wall face of the frame and of which the free ends turned to the design cover have cam-typed wall reinforcements orientated outwards and situated on the outer wall.

At least two plate-shaped blanks with spring-elastic snap-in tongues which are respectively molded on two opposed side wall faces of the frame on the side wall faces are molded on the peripheral wall face of the frame of the basic casing.

The plate-shaped blanks with the spring-elastic snap-in tongues are molded on the middle of the side wall faces of the frame of the basic casing on the side wall faces.

For a further preferred embodiment according to the invention, four plate-shaped blanks with the spring-elastic snap-in tongues are molded in the corner areas of the basic casing on the side wall faces of the frame, wherein the arrangement of the plate-shaped blanks are provided on respectively two opposed side wall faces of the frame of the basic casing.

It is essential for the invention that the spring-elastic snap-in tongues are formed by slit-shaped indents in each plate-shaped blank.

This being the case, the lengths of the spring-elastic snap-in tongues of each plate-shaped blank are formed so as to decrease in a direction of the outer edges of two abutting side wall faces of the frame of the basic casing.

Each plate-shaped blank with its spring-elastic snap-in tongues preferably is made of a synthetic material. The basic casing of the filter fan can also be made of a synthetic material.

According to a further embodiment of the invention, the filter fan and the plate-shaped blanks with the spring-elastic snap-in tongues are made of the same synthetic material.

The advantage which is achieved with the filter fan configured according to the invention consists in that the catching corners configured for the known filter fans remain unchanged with respect to their conformation and that small snap-in tongues which definitely audibly snap-in are created only by slit formations. According to the different sheet metal thicknesses of the mounting walls, the respectively corresponding snap-in tongue catches and is additionally secured for thinner sheet metal with the already pressed snap-in tongues, which is possible due to the fact that the lengths of the snap-in tongues are reduced to the outer edge area. In this manner, a safer catching of the filter fan in the cutout of a mounting wall is guaranteed independently from the sheet metal thickness of the mounting wall or from the thickness of the coat of lacquer applied on the mounting wall.

The various features of novelty which characterize the invention are pointed out with particularity in the claims annexed to and forming a part of the disclosure. For a better understanding of the invention, its operating advantages, specific objects attained by its use, reference should be had to the drawing and descriptive matter in which there are illustrated and described preferred embodiments of the invention.

DESCRIPTION OF THE PREFERRED EMBODIMENTS

Figure 1:
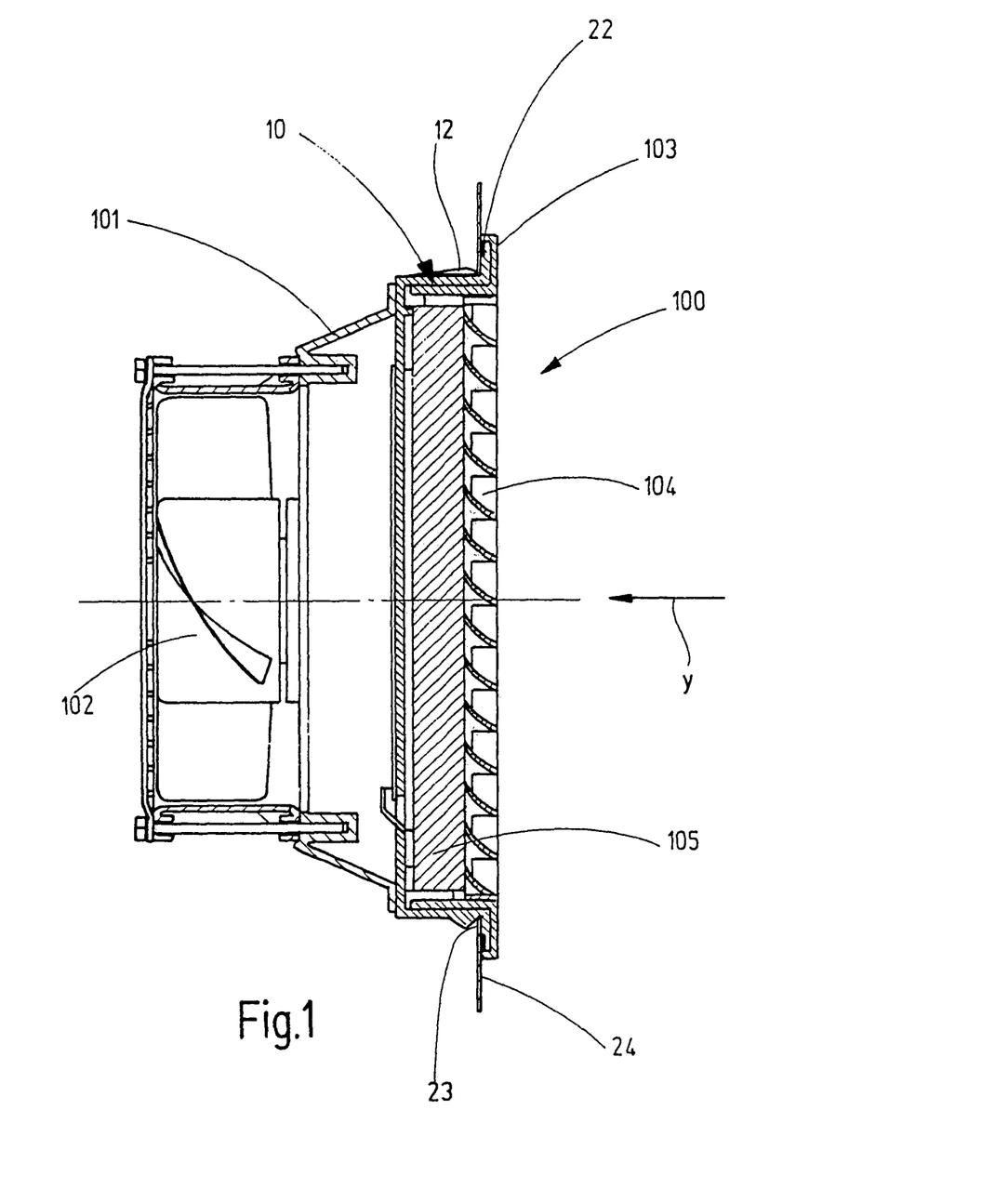
FIG. 1 is a vertical sectional view of a filter fan.
Figure 2:
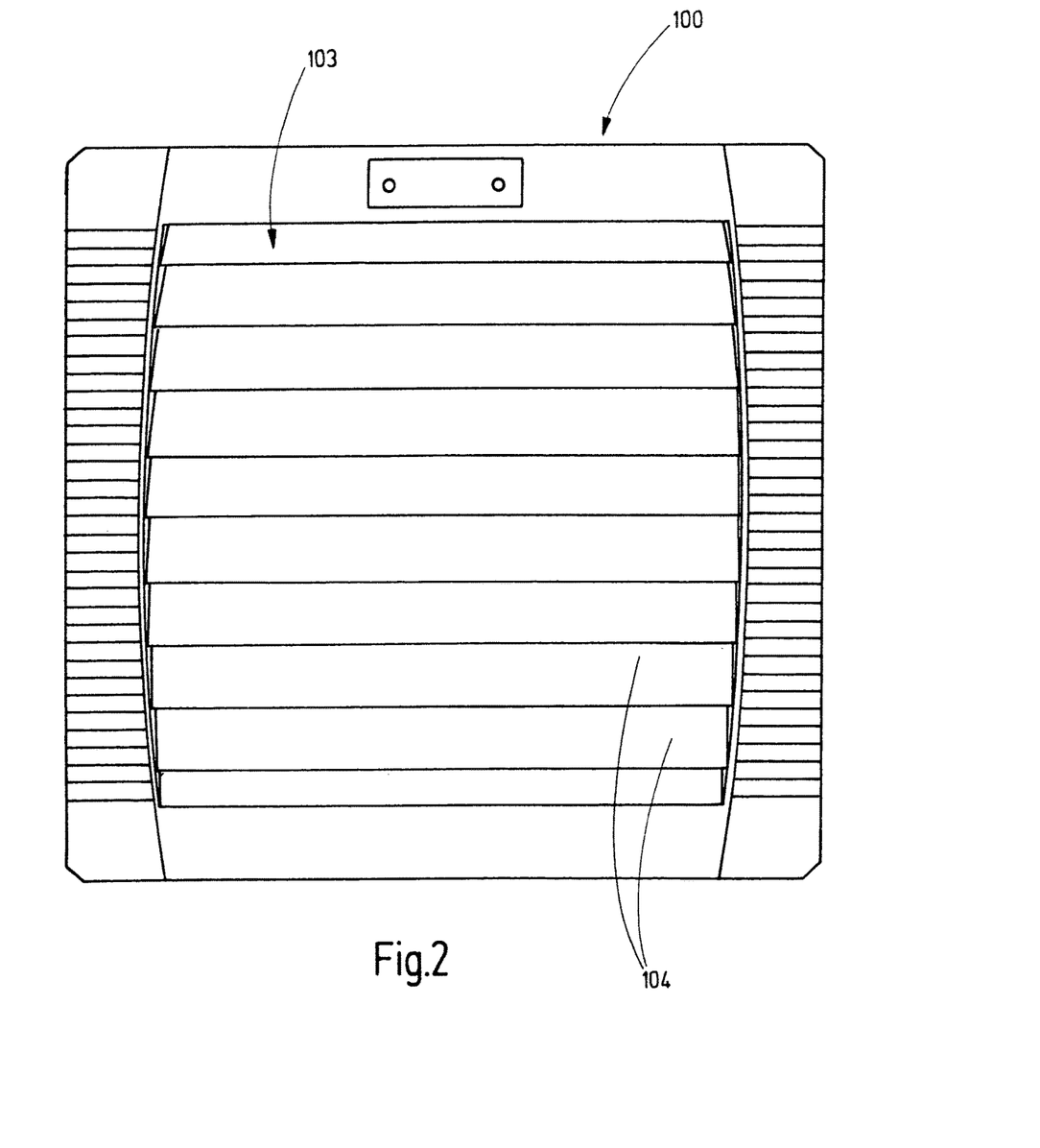
FIG. 2 is a front view of the filter fan.
Figure 3:
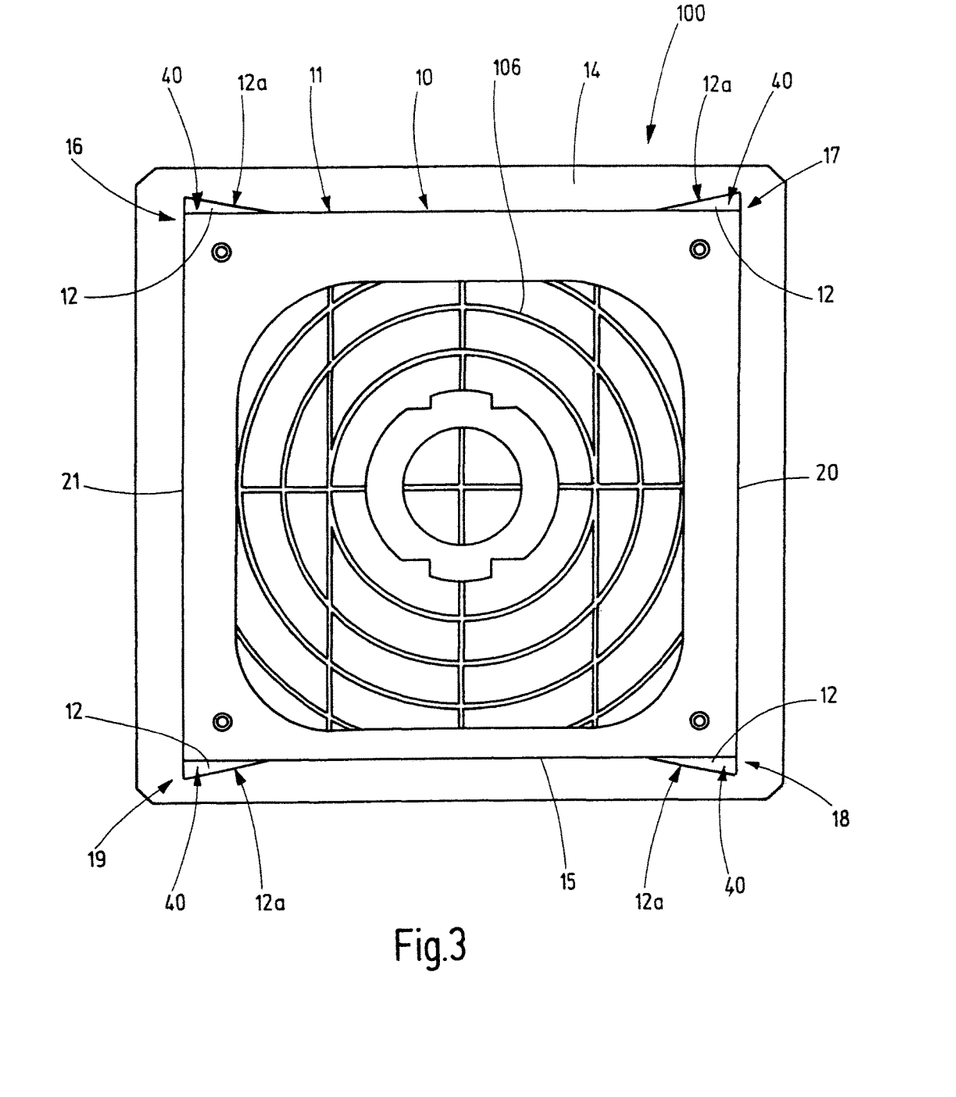
FIG. 3 is a rear view of the filter fan with wing-type brackets for the quick fixing of the filter fan on a mounting wall.
Figure 4:
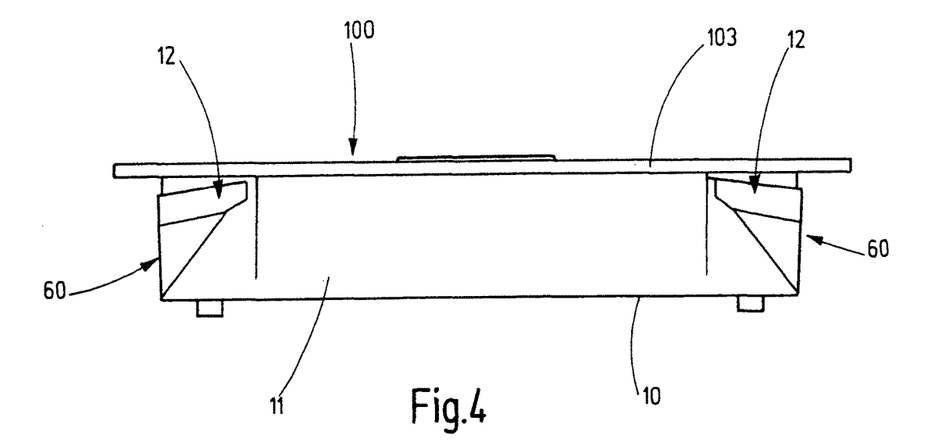
FIG. 4 is a top view of the frame of the filter fan with the wing-type brackets.
Figure 5:
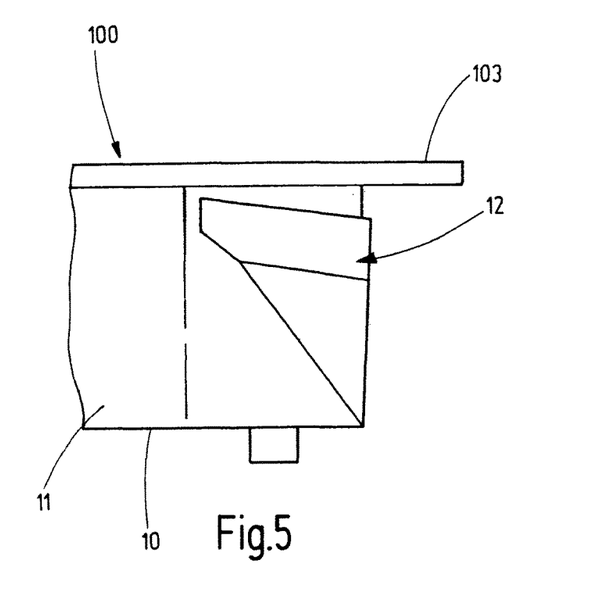
FIG. 5 is an enlarged view of a section of the frame of the filter fan with a wing-type bracket.
Figure 6:
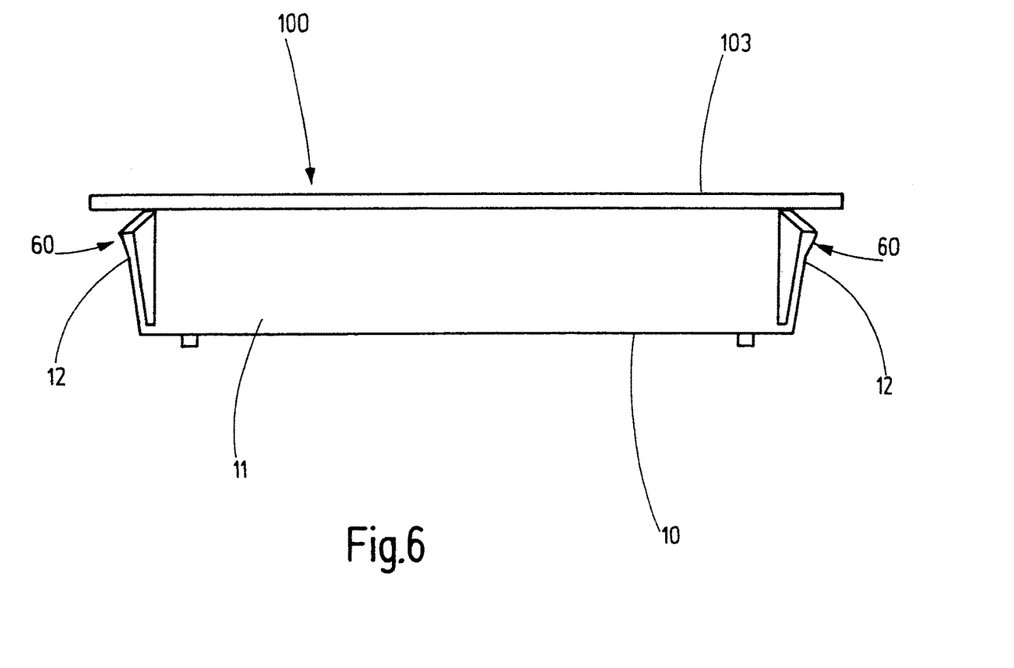
FIG. 6 is another top view of the frame of the filter fan with the wing-type brackets.
Figure 7:
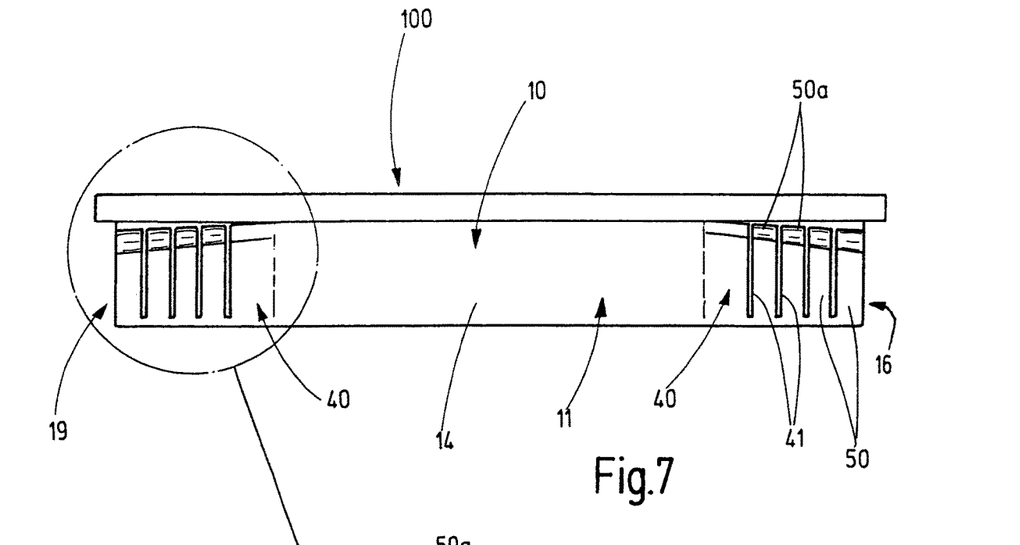
FIG. 7 is a top view of the filter fan with wing-type brackets placed in the corner areas of the frame of its basic casing with snap-in tongues configured therein.
Figure 7A:
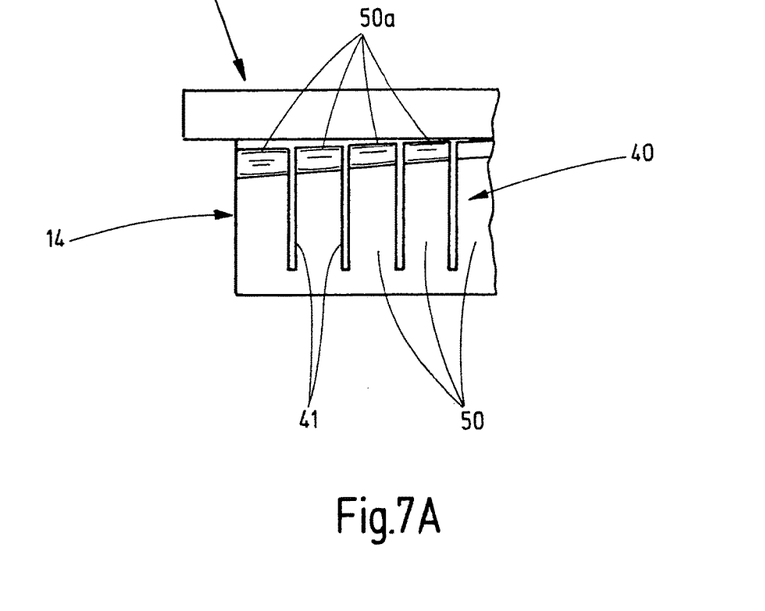
FIG. 7A is an enlarged view of a corner area of the frame according to FIG. 7 with the wing-type bracket which has snap-in tongues.

The filter fan 100 shown in FIG. 1 to 3 includes of a basic casing 10 with a blast support 101 which receives an electric motor driven blast 102. The rear wall of the blast support 101 which is configured open is closed by means of a protecting grid 106 (FIG. 3). A frame 11 is preferably molded on the basic casing 10. For a square or rectangular filter fan 100, the frame 11 consists of four side walls 14, 15, 20, 21 (FIG. 10).

The basic casing 10 has on the front side a design cover 103 with air conduction devices, for example in form of lamellae 104 (FIGS. 1 and 2). The design cover 103 or the basic casing 10 receives a filter mat 105 for filtering the air conveyed through the filter fan 100 in direction of the arrow Y (FIG. 1). The filter fan 100 is made of one or several plastic injection molded parts and/or of metal parts. The design cover 103 is preferably removably connected with the basic casing 10 over a peripheral gasket 22 in order to be able to replace the filter mat 105 (FIG. 1).

Figure 9:
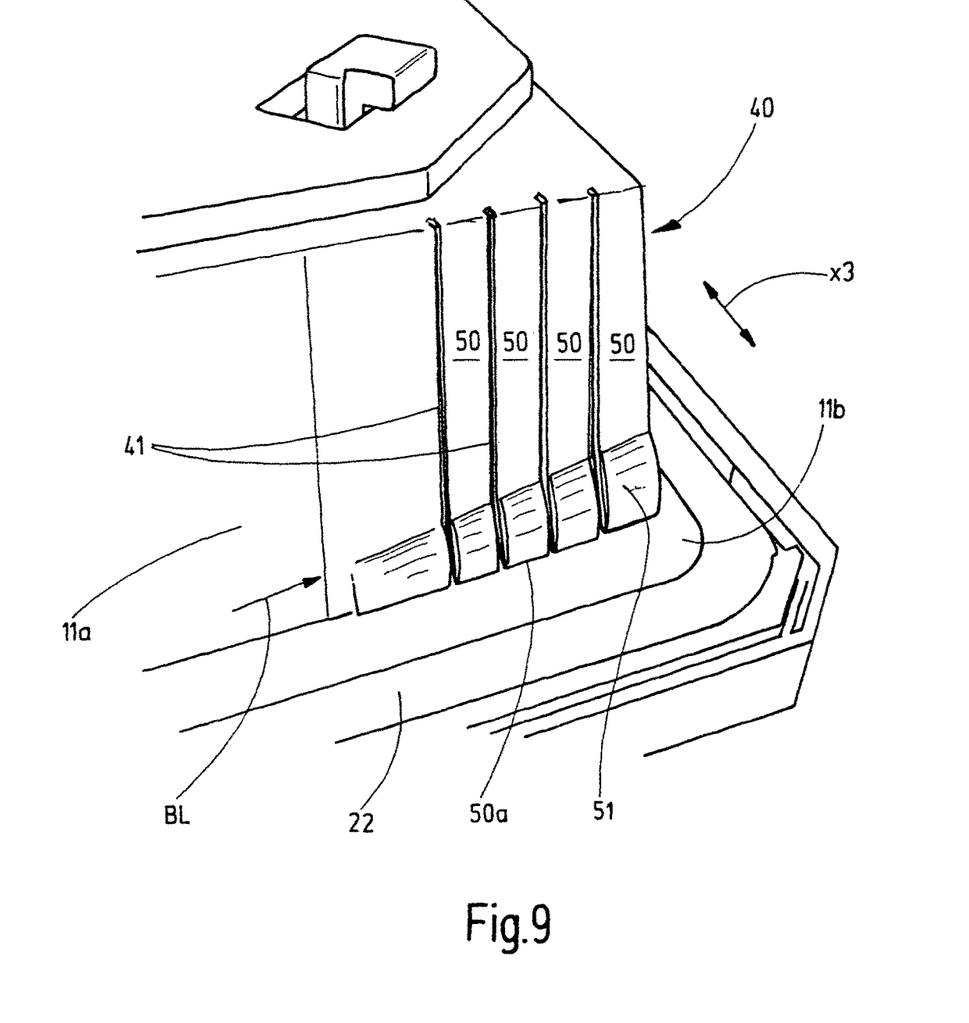
FIG. 9 is a graphical view of a corner area of the filter fan with the wing-type bracket which has snap-in tongues.

The filter fan 100 with its basic casing 10 is placed, when mounted, in a cutout 23 in a mounting wall 24, for example of a switch cupboard (FIG. 1). The removable fixing or support of the filter fan 100 in the cutout 23 of the mounting wall 24 takes place over a snap-in connection with quick fixing devices 60 placed on the frame 11 of the basic casing 10 which are formed as snap-in element 12a in form of brackets 12 which have spring-elastic snap-in tongues 50 (FIGS. 9 and 10).

Figure 10:
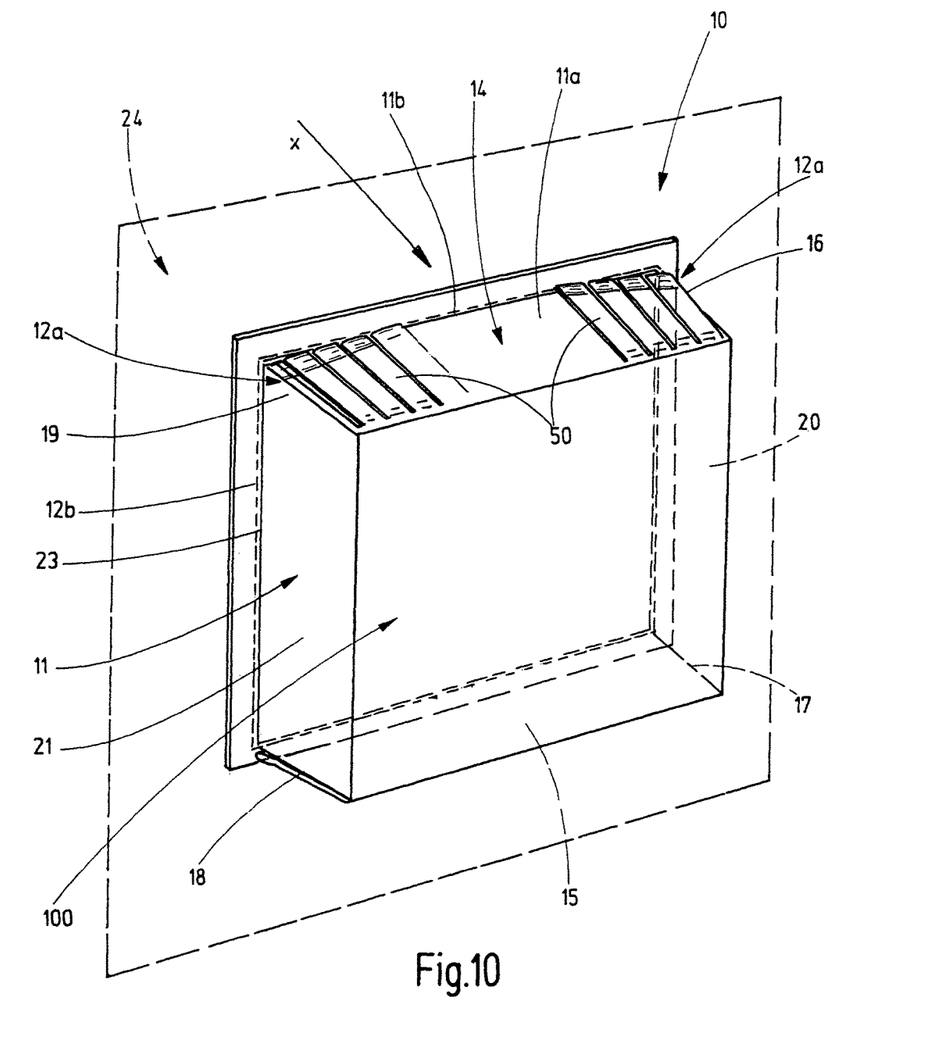
FIG. 10 is a graphical view of the filter fan placed in the opening of a mounting wall.

For the removable fixing of the filter fan 100 in the cutout 23 of the mounting wall 24, the filter fan 100 is introduced into the cutout 23, as indicated by the arrow X (FIG. 10). This being, the brackets 12 which are molded on the frame 11 and which form wing-type and spring-elastic snap-in elements (12a) are slightly distorted in direction of the middle of the cutout 23, as illustrated by the double arrow X3 (FIG. 9). The brackets 12 are preferably molded on the side parts 14, 15, 20, 21 of the frame 11 and are made in one piece with them (FIGS. 3, 4, 5, 6, 7, 7A, 8, 8A, 9 and 10).

Figures 8, 8A:
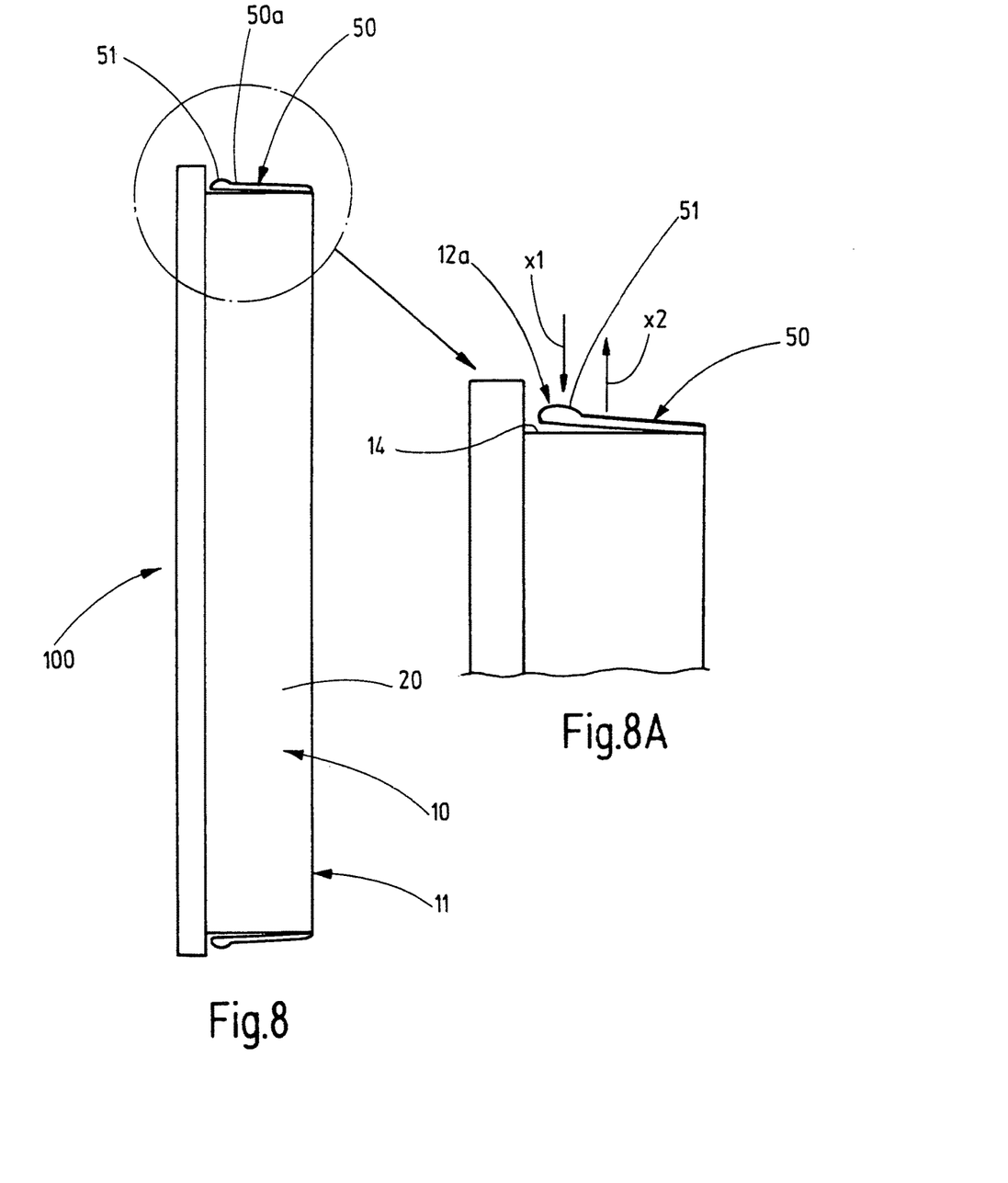
FIG. 8 is a side view of the filter fan with wing-type brackets with the snap-in tongues placed in the corner areas of the frame according to the invention.
FIG. 8A is an enlarged view of a corner area of the frame according to FIG. 8 with the bracket.

The brackets 12 spring back into their starting position in the direction of the arrow X2 and lock the filter fan 100 in its set-in position as soon as the filter fan 100 is pushed widely enough into the cutout 23 of the mounting wall 24, wherein the brackets 12 are pushed in direction of the arrow X1 against the wall face of the side wall 14 (FIGS. 8 and 8A). The brackets 12 can be pushed again slightly inwards in direction of the arrow X1 in order to remove the filter fan 100 (FIG. 11).

Figure 11:
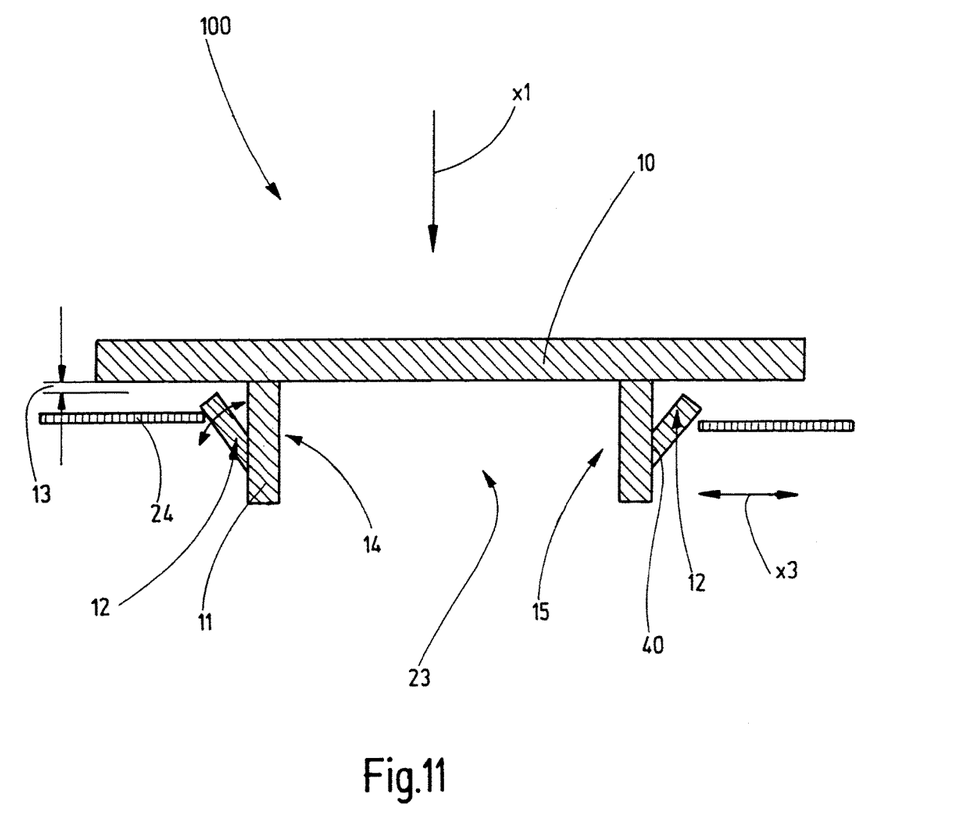
FIG. 11 is a cross-sectional view through the filter fan with the wing-type brackets placed in the cutout of a mounting wall.

In order to fix the filter fan 100 for example to a metal or plastic casing of a computer, of a switch cupboard or the like, the distance or the intermediate space 13 between an upper edge 25 of a bracket 12 and a mounting wall bearing edge of the basic casing 10 is preferably selected in a range between one and four millimeters (FIG. 11).

This being, the brackets 12 can be placed either on the frame 11 in the corner area 16, 17, 18, 19 of the frame 11 or in the middle of a side wall 14, 15, 20, 21 (FIG. 3). The brackets 12 can also be placed distributed in any other manner on the frame 11. The brackets 12 can be molded in any way, however preferably triangular or rectangular. The brackets 12 are formed out of the wall material of the frame 11 (FIG. 9) or molded thereon (FIG. 6) so that the side walls 14, 15, 20, 21 of the frame 11 always form closed wall faces.

The number of the brackets 12 can be selected any, their arrangement on the frame 11 as well. Besides an arrangement of the brackets 12 in the corner areas 16, 17, 18, 19, the brackets 12 can also be provided in the central side wall areas of the frame 11. At least two brackets 12 should be provided on opposed side walls of the frame 11. The brackets 12 are preferably made of the material of the frame 11, however the brackets have an spring-elastic configuration because of which the bracket 12 can spring back after neutralization of a pressure exerted onto the brackets.

In order to seal the filter fan 100, when mounted, i.e. when the mounting wall bearing edge or the basic casing 10 substantially bears at flush level on the whole surface on the mounting wall 24, a rubber sealing 22 running continuously around the filter fan 100 is made of a plastic material appropriate for this. In particular, the rubber sealing 22 is glued in a groove in order to avoid the penetration of air and/or moisture between the filter fan 100 and the mounting wall 24 (FIGS. 1 and 9).

Each bracket 12 fixed on the frame 11 of the basic casing 10 of the filter fan 100 is configured as a plate-shaped blank 40 which is provided with a number of slits 41 for constituting spring-elastic snap-in tongues 50 (FIGS. 7, 7A, 9 and 10). Each plate-shaped blank 40 is molded on the one end on the wall face 11*a* of the frame 11. This being, the number of slits 11 can be selected any and thus also the number of snap-in tongues 50. These spring-elastic snap-in tongues 50 have approximately a length which corresponds to the width of the wall face 11*a* of the frame 11. Their ends 50*a* of the snap-in tongues 50 which are turned to the design cover 103 have cam-type wall reinforcements 51 on the outer wall side (FIGS. 8, 8A and 9). These cam-type wall reinforcements 51 are provided with sliding surfaces in order to guarantee an easy introduction of the brackets into the cutout 23 of the mounting wall 24.

The lengths of the spring-elastic snap-in tongues 50 of each plate-shaped blank 40 are configured decreasing in direction of the outer edges 11*b* of two abutting side walls 14, 15, 20, 21 of the frame 11 (FIG. 9). The free ends 50*a* are preferably slightly bent off outwards.

According to FIG. 9, the ends 50*a* of the snap-in tongues are slightly bent off, wherein the spring-elastic line BL is oblique so that there result bent-off end sections with a different length.

The plate-shaped blanks 40 with their snap-in tongues 50 are preferably made of a plastic material which causes the spring-elastic properties of the snap-in tongues 50.

While specific embodiments of the invention have been described in detail to illustrate the inventive principles, it will be understood that the invention may be embodied otherwise without departing from such principles.

I claim:

1. A filter fan, comprising a basic casing with a rectangular frame having four side walls, wherein the frame is provided with quick fixing devices formed by elastic snap-in elements provided as spring-elastic brackets for removable fixing of the filter fan on a peripheral mounting edge of a cut out in a mounting wall of a switch cupboard, wherein said four side walls are connected with each other so as to form the rectangular frame, wherein the four side walls are not disposed within a common plane, wherein contact surfaces for contacting the mounting wall when the filter fan is fixed on the peripheral mounting edge of the cut out in the mounting wall protrude from each side wall outwards at an angle of substantially 90°, wherein the contact surface of each side wall is connected with a neighboring contact surface so as to form a continuous collar protruding from said frame, wherein said four side walls of the frame and said collar each have a continuously closed outer peripheral surface, wherein several plate-shaped blanks which form the snap-in elements are configured on the outer peripheral surface of the side walls of the frame, each of said plate-shaped blanks being molded directly onto the outer peripheral surface of the side walls of the frame and wherein each of the plate-shaped blanks is provided with a plurality of substantially parallel slits for constituting a number of parallel spring-elastic snap-in tongues so that a snap-in connection to the peripheral mounting edge of the cut out in the mounting wall can be established.

2. The filter fan according to claim 1, wherein the basic casing is provided with a design cover with air passage slits formed as lamellae, wherein the frame comprises a peripheral closed wall face, wherein each plate-shaped blank is molded at one end side onto the outside of the side walls of the frame and has at least one spring-elastic snap-in tongue formed by the plurality of slits which are transverse to a longitudinal direction of the wall face of the frame, the snap-in tongues having a length that substantially corresponds to a width of the wall face of the frame and free ends turned to the design cover, which free ends have cam-typed wall reinforcements on an outer wall side.

3. The filter fan according to claim 1, wherein the brackets are molded onto an upper side and/or a lower side of a rectangular filter fan respectively on a corner area.

4. The filter fan according to claim 1, wherein the brackets are respectively molded onto at least one side wall of the frame.

5. The filter fan according to claim, 4, wherein at least one bracket is provided at least on respectively two opposed side walls of the frame.

6. The filter fan according to claim 1, wherein at least two plate-shaped blanks with spring-elastic snap-in tongues, which are respectively molded on two opposed side wall faces of the frame, are molded on the peripheral wall face of the frame of the basic casing.

7. The filter fan according to claim 1, wherein the plate-shaped blanks with the spring-elastic snap-in tongues are molded on a middle of the side walls of the frame of the basic casing on the side wall faces.

8. The filter fan according to claim 1, wherein four plate-shaped blanks with the spring-elastic snap-in tongues in corner areas of the basic casing are molded on the side wall faces of the frame, wherein the plate-shaped blanks are provided on respectively two opposed side wall faces of the frame of the basic casing.

9. The filter fan according to claim 1, wherein the spring-elastic snap-in tongues of each plate-shaped blank have lengths, said lengths decreasing in direction towards an outer edge of two abutting side walls of the frame of the basic casing, wherein free ends of the snap-in tongues are slightly bent off outwardly.

10. The filter fan according to claim 1, wherein each plate-shaped blank with the spring-elastic snap-in tongues is made of a synthetic material.

11. The filter fan according to claim 1, wherein the basic casing with the frame is of a synthetic material.

12. The filter fan according to claim 1, wherein the basic casing and the plate-shaped blanks with the spring-elastic snap-in tongues are of the same synthetic material.

13. The filter fan according to claim 1, wherein a sealing assembly is associated with the mounting wall bearing edge.

14. The filter fan according to claim 13, wherein the sealing assembly is a rubber gasket set into a groove.

15. The filter fan according to claim 1, wherein said four side walls are configured to extend through the cut out in the mounting wall.

* * * * *